United States Patent [19]

Farmer, Jr.

[11] 4,317,223
[45] Feb. 23, 1982

[54] RF GENERATOR MONITOR CIRCUIT

[75] Inventor: Felta C. Farmer, Jr., Gas City, Ind.

[73] Assignee: RCA Corporation, New York, N.Y.

[21] Appl. No.: 173,413

[22] Filed: Jul. 29, 1980

[51] Int. Cl.$^3$ .................................. H04B 17/00
[52] U.S. Cl. .................................. 455/115; 324/78 Z; 324/82; 328/141; 331/64; 340/658; 455/226
[58] Field of Search ............... 455/9, 67, 115, 117, 455/125, 226; 361/85; 328/140, 141; 307/522, 523, 526; 331/11, 62–64; 340/658, 661; 324/78 Q, 78 Z, 82

[56] References Cited

U.S. PATENT DOCUMENTS

| | | | |
|---|---|---|---|
| 3,649,909 | 3/1972 | Ort et al. | 455/115 |
| 3,750,177 | 7/1973 | Rooks | 455/226 |
| 3,992,670 | 11/1976 | Gittins et al. | 455/115 |
| 4,152,656 | 5/1979 | Udvari-Lakos | 328/141 |

FOREIGN PATENT DOCUMENTS 708255 1/1980 U.S.S.R. ...................... 324/78 Z

*Primary Examiner*—Marc E. Bookbinder
*Attorney, Agent, or Firm*—Eugene M. Whitacre; Dennis H. Irlbeck; Lester L. Hallacher

[57] ABSTRACT

An RF generator monitor circuit is provided for checking for variation in frequency of an RF generator outside predetermined limits. The circuit includes means for sampling the output of an RF generator, means for clamping the sample signal to prevent damage to the circuit from an exceptionally strong signal, means for converting the clamped sample signal to a positive going square wave, and for amplifying the square wave. Also included is a phase locked loop integrated circuit having the amplified square wave as an input. The phase locked loop integrated circuit includes a linear voltage-controlled oscillator and two different phase comparators. The input square wave signal is compared to the voltage controlled oscillator and an error voltage proportion to phase differences is produced. The error voltage is used as a control for the voltage controlled oscillator. When the input square wave signal is within the predetermined frequency limits the error voltage causes the voltage controlled oscillator to be adjusted to a frequency equal to that of the input signal. When the input signal is outside the predetermined limits the phase comparators provides output signals indicative thereof.

7 Claims, 1 Drawing Figure

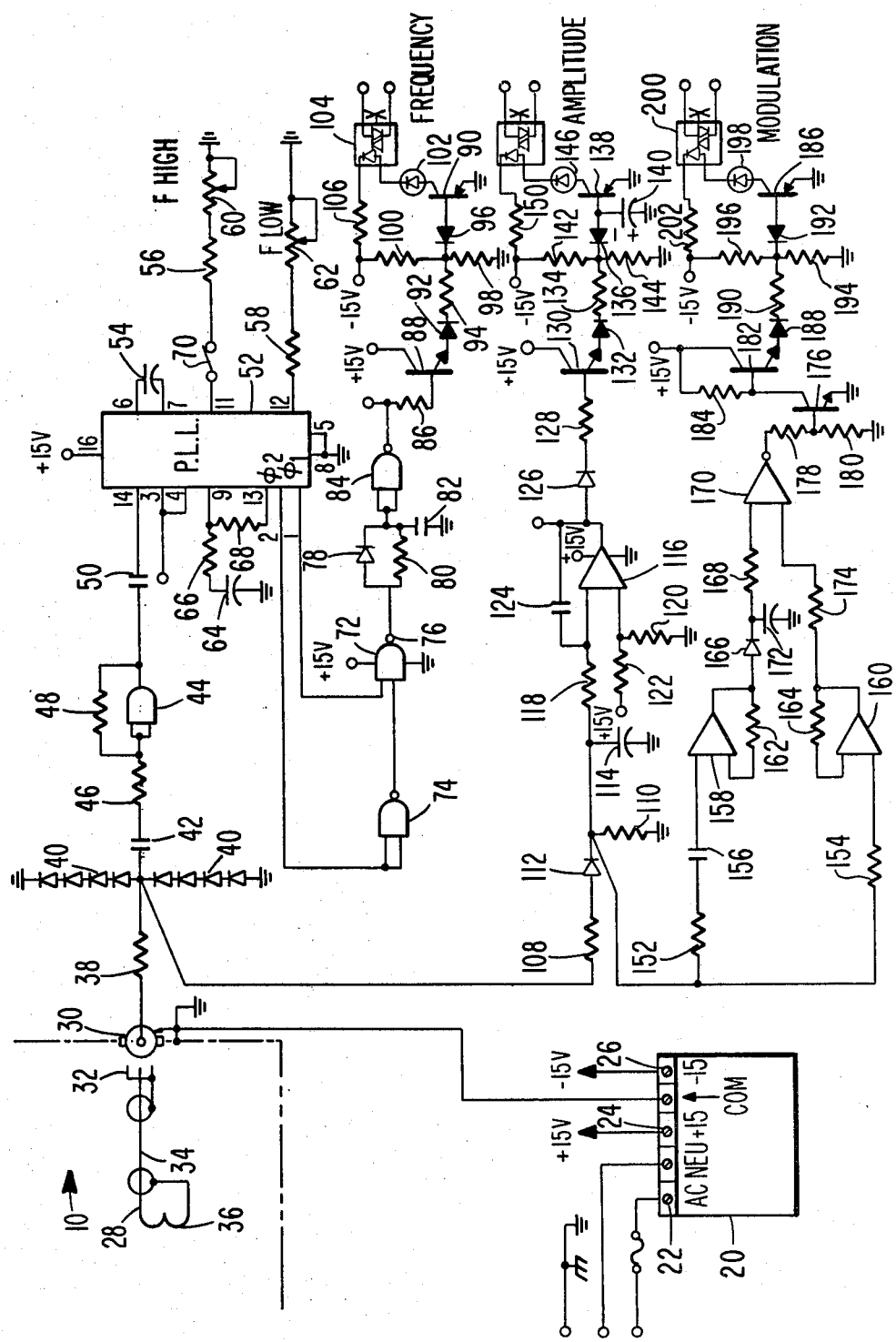

RF GENERATOR MONITOR CIRCUIT

BACKGROUND OF THE INVENTION

This invention relates to the monitoring of radio frequency generator outputs and particularly to a circuit for monitoring such outputs.

Many types of radio frequency (RF) generating equipment are used in industry and elsewhere for the purpose of induced heating. These generators are subject to federal regulations and are periodically checked for compliance. Generator malfunctions including change of operating frequency, loss of output power and/or carrier modulation may occur in between checks or maintenance inspections. These malfunctions are likely to result in an improperly processed product or in other problems depending on the generator's application or use. A malfunction in the generator may not be apparent to an operator or to an automatic control system so that the problem may exist for a long time and result in a large amount of poorly manufactured goods.

A need exists for a method and apparatus to monitor the output of such RF generators to detect frequency drift, lack of output, and modulation of the RF carrier due to power supply ripple. Such apparatus should be light-weight, small and suitable for fixed installation or portable use. It also should provide indicator lights to signal when and if a fault exists and should provide for connection with automatic control equipment when used in a fixed installation. This apparatus could be used to perform a continuous or periodic check of RF generators, RF induction heaters, diathermy equipment (medical and therapeutic equipment) and other similar equipment. A particular application would be to monitor the output of an RF generator used for getter flashing of color picture tubes.

SUMMARY OF THE INVENTION

An RF generator monitor circuit is provided for checking for variation in frequency of an RF generator outside predetermined limits. The circuit includes means for sampling the output of an RF generator, means for clamping the sample signal to prevent damage to the circuit from an exceptionally strong signal, means for converting the clamped sample signal to a positive going square wave and for amplifying the square wave. Also included is a phase locked loop integrated circuit having the amplified square wave as an input. The phase locked loop integrated circuit includes a linear voltage-controlled oscillator and two different phase comparators. The input square wave signal is compared to the voltage controlled oscillator and an error voltage proportional to phase differences is produced. The error voltage is used as a control for the voltage controlled oscillator. When the input square wave signal is within the predetermined frequency limits the error voltage causes the voltage controlled oscillator to be adjusted to a frequency equal to that of the input signal. When the input signal is outside the predetermined limits the phase comparators provides output signals indicative thereof.

BRIEF DESCRIPTION OF THE DRAWINGS

The single drawing is a circuit diagram of an RF generator monitor circuit.

DETAILED DESCRIPTION OF THE PREFFERED EMBODIMENT

A circuit constructed in accordance with the present invention will sense a variation in a radio frequency output in at least one of frequency, amplitude or modulation. In the embodiment presented herein, variations in all three parameters, frequency, amplitude and modulation are monitored for variations outside specified limits.

Referring to the drawing of an RF generator monitor circuit 10, a power supply 20 converts alternating current line voltage entering at the terminal 22 to +15 volts DC and −15 volts DC, at terminals 24 and 26, respectively. These DC voltages are used to power the circuit 10.

In the circuit 10, means for sampling the RF generator output include a pickup lead or antenna 28 which is connected to an RF signal input terminal 30 to provide the sample of the RF generator output. The pickup lead shown consists of a plug 32 to match the terminal 30, a suitable length of coaxial cable 34, and a pickup coil 36 made by removing some of the shield braid from the coaxial cable 34 and winding the exposed center conductor two or more times around the insulated RF cable. The center conductor is connected to the shield to provide a current path. Note that this scheme also may be used to sample the RF signal in other ways, such as by holding the coil close to the RF generator output work coil. Other types of pickups also could be used to provide the required sample of the generator output if desired.

A resistor 38, connected to the terminal 30, is used to limit current in the input lead. Means for clamping include eight diodes 40 which form a protective clamp for limiting the voltage applied to the inputs of the active devices to approximately ±2.8 v (5.6 v peak to peak). Four of these diodes 40 are forwardly connected in series between the resistor 38 and ground and the other four diodes 40 are reverse connected in series between the resistor 38 and ground.

FREQUENCY MONITORING PORTION OF CIRCUIT

A capacitor 42, connected to the common point connection of the diodes 40 to the resistor 38, is used to AC couple the input signal to an amplifier 44 (such as RCA ¼ CD4011BE) and forms a high pass filter, together with a resistor 46 connected between the capacitor 42 and the amplifier 44, which has a break frequency of 5.9 KHZ. The resistor 46 also is the input resistor to the inverting amplifier 44. A resistor 48, connected between the output and input of the amplifier 44, is the feedback resistor. This amplifier 44 has a gain of 370 and is used to buffer the incoming signal. The amplifier 44 also provides means for converting the incoming signal to a positive going square wave. This square wave is AC coupled through a capacitor 50 to a phase locked loop integrated circuit 52. The capacitor 50 is connected between the output of the amplifier 44 and terminal 14 of the integrated circuit 52.

The phase locked loop integrated circuit 52 preferably is one similar to RCA integrated circuit CD 4046B. Operation of such integrated circuit is described in RCA Data Book #SSD-250 *COS/MOS-INTEGRATED CIRCUITS*. The RCA-CD4046B is a COS/-MOS micropower phase-locked loop (P.L.L.) consisting of a low power linear voltage-controlled oscillator and two different phase comparators having a common signal-input amplifier and a common comparator input. A 5.2 volt zener diode also is included for supply regulation if necessary. The components attached to the integrated circuit 52, including a capacitor 54, resistors 56 and 58 and potentiometers 60 and 62, determine the operating frequency range of the phase locked loop integrated circuit 52. A low pass filter, comprised of a capacitor 64 and resistors 66 and 68, sets the capture range of the integrated circuit 52. The capacitor 54 is connected between terminals 6 and 7 of the integrated circuit 52. The resistor 56 and the potentiometer 60 are connected in series and are connected at one end to terminal 11 of the integrated circuit 52 through a switch 70 and are connected at the other end to ground. The resistor 58 and the potentiometer 62 are connected in series and are connected at one end to terminal 12 of the integrated circuit 52 and are connected at the other end to ground. The resistor 68 is connected between terminals 9 and 13 of the integrated circuit 52 and the resistor 56 and the capacitor 64 are connected between terminal 9 and ground. Terminals 3 and 4 of the integrated circuit 52 are connected together and terminals 5 and 8 are connected together and grounded. Plus 15 volts is applied to terminal 16 of the integrated circuit 52. The aforementioned RCA Data Book provides a description of the procedure, nomograms and formulas used for choosing the values of these components.

The integrated circuit 52 has two phase comparator outputs $\phi 1$ and $\phi 2$ at terminals 1 and 2, respectively. The output of the phase comparator $\phi 1$ is connected to a NAND gate 72. The output phase of the comparator $\phi 2$ is connected to an inverting buffer 74 which in turn is connected to the gate 72. When the input signal has sufficient amplitude, is at the correct frequency, and is not modulated, the signal at an output pin 76 of the gate 72 will be a low level with short duration positive voltage spikes. The spikes exist because the voltage controlled oscillator in the integrated circuit 52 must always run at a slightly different phase from the input so that a small error voltage will exist to control the oscillator. A network composed of a diode 78, resistor 80 and a capacitor 82 is used to filter the signal applied to an inverting buffer 84. The diode 78 and the resistor 80 are connected in parallel between the output 76 of the gate 72 and the input of the inverting buffer 84. The capacitor 82 is connected between the input to the buffer 84 and ground. The resistor 80 and the capacitor 82 form a low pass filter integrator. The diode 78 couples the positive pulses around the resistor 80 so that the sensitivity of the circuit 10, to amplitude or frequency modulation of frequency drift, is increased. The diode 78 may be omitted, if desired, to reduce the circuit response to modulation.

A resistor 86, connected between the output of the buffer 84 and the base of an NPN transistor 88, is a base current limiting resistor for the transistor 88. The transistor 88 operates as an emitter follower stage to turn off a PNP transistor 90 when a positive voltage is applied to the base of the transistor 88. The emitter of the transistor 88 is connected to the base of the transistor 90 through a forward diode 92, a resistor 94 and a reverse diode 96 all connected in the order named in series. A resistor 98 is connected between the junction of the resistor 94 and the diode 96 and ground. Another resistor 100 is connected between the same junction and the −15 volt supply. When the transistor 88 is conducting, the junction of the resistors 94, 98 and 100 and the diode 96 will be at approximately +8 volts and the transistor 90 will be cut off. When the transistor 88 is not conducting, the voltage divider composed of resistors 98 and 100 provides a voltage of approximately −1.6 volts to the base of the transistor 90. The collector of the transistor 90 is connected to a light emitting diode 102 which is connected to a photocoupler 104. The photocoupler 104 is attached through a resistor 106 to the same −15 volt supply as is the resistor 100. When the transistor 90 is conducting, the photocoupler 104 and the light emitting diode 102 also will be conducting. The photocoupler 104 is used to couple the output from this portion of the circuit 10 to an isolated line voltage alarm or control circuit external to the circuit 10. The light emitting diode 102 provides a visual indicator of a variation in frequency.

AMPLITUDE MONITORING PORTION OF CIRCUIT

An envelope detector composed of two resistors 108 and 110, a diode 112, and a capacitor 114 is used to provide signal to the other portions of the circuit 10. The resistor 108 is connected to the junction of the resistor 38 with the diodes 40. The diode 112 is connected in series with the resistor 108. The resistor 110 and the capacitor 114 are connected in parallel between the output side of the diode 112 and ground. The resistor 108 is for current limiting in the diode 112 which is used as a detector diode. The capacitor 114 and the resistor 110 are a low pass filter for a break frequency of 234 HZ neglecting loading effects of the other portions of the circuit 10.

The junction of the diode 112, the resistor 110 and the capacitor 114 are connected to an inverting input of an amplifier 116 through a resistor 118. The amplifier 116 is used as a high gain comparator. Two resistors 120 and 122, connected in series between the +15 volt supply and ground with the junction of the resistors 120 and 122 connected to the non-inverting input of the amplifier 116 act as a voltage divider which provides a small positive voltage to the non-inverting input. The output of the amplifier 116 stays positive until the input signal voltage, applied through the input resistor 118 to the inverting input of the amplifier 116, exceeds the positive reference voltage; then the output swings negative. The output of the amplifier 116 is connected to its input through a capacitor 124. The capacitor 124 around the amplifier 116 causes the circuit portion to behave similar to an integrator and provide high frequency noise rejection. A diode 126 and a resistor 128 are connected in series to the output of the amplifier 116 and to the base of the NPN transistor 130. A diode 132 is connected to the emitter of the transistor 130 and the collector of the transistor 130 is attached to the +15 volt supply. The diode 132 is connected through a resistor 134 and a reverse diode 136 to the base of a PNP transistor 138. The base of the transistor 138 also is connected to ground through a capacitor 140. A resistor 142 is connected between the junction of the resistor 134 and the diode 136 and the −15 volt supply. Another resistor 144 is connected between the same junction and ground. When the output of the amplifier 116 is negative, the diode 126, the transistor 130 and the diode 132 are not conducting and the transistor 138 is conducting, this portion of the circuit 10 is very similar to the portion previously described except for additonal parts of the diode 126 and the capacitor 140. The diode 126 provides an additional small forward voltage drop to increase noise immunity, and the capacitor 140 is used for low pass filtering. Note that the capacitor 140 should be either non-polarized or of a type that can withstand reverse voltage, unless the diode 136 (which is optional) is used between the base of the transistor 138 and the junction of resistors 134, 142, and 144. Also note that the diode 136 is used in a similar way in the previously discussed portion of the circuit 10. The published reverse VBE voltage specification for a transistor type 2N3644, as is preferred for the transistor 138 is 5 volts. However, the BE junction will undergo zener breakdown at about 8 volts. Without the extra diode 136, the transistor 130 would run warm because of a 6 volt drop across it. A light emitting diode 146 is connected between the collector of the transistor 138 and a photocoupler 148. The photocoupler 148 also is connected to the −15 volt supply through a resistor 150. The light emitting diode 146 provides a visual indicator of a variation in amplitude; and the photocoupler 148 is used to couple the output from this portion of the circuit 10 to an isolated line voltage alarm or to a control circuit external to the circuit 10.

MODULATION MONITORING PORTION OF CIRCUIT

A third portion of the circuit 10 includes two resistors 152 and 154 each connected to the junction of the diode 112, the resistors 110 and 118 and the capacitor 114. The resistor 152 is connected through a capacitor 156 to an input of an amplifier 158. The resistor 154 is connected to the input of another amplifier 160. Both the amplifiers 158 and 160 have resistors, 162 and 164, respectively, connected between their outputs and their inputs. The output of the amplifier 158 is connected through a diode 166 and a resistor 168 in series to a first input of another amplifier 170. The junction between the diode 166 and the resistor 168 is connected to ground through a capacitor 172. The output of the amplifier 160 is connected to a second input of the amplifier 170 through a resistor 174.

The amplifier 158 is an alternating current coupled stage. The resistor 152 is an input current limiting resistor and forms a high pass filter with the capacitor 156 that has about a 6 HZ break. The capacitor 156 is used for DC blocking. The amplifier 158 is a follower amplifier (AV ≈ ∞/∞ = 1) which provides current to charge the integrating capacitor 172 from the positive half cycles of the modulation envelope. The voltage on the capacitor 172 is, therefore, related to the percentage of modulation as well as the amaplitude of the signal. The amplifier 160 is a follower amplifier (AV ≈ 1) which provides the detected instantaneous peak voltage to the amplifier 170 where it is compared with the signal on the capacitor 172. This comparison partially offsets the change in voltage at the capacitor 172 due to amplitude changes in the incoming signal. This forms a crude but useful amplitude modulation percentage comparator which has a limit of approximately 20% when the input amplitude (unmodulated) is approximatelay 2.4 V peak to peak. Other levels can be set by altering the gains of the amplifier 158 and/or by adding a resistor from the inverting terminal to ground. The output of the amplifier 170 is connected to the base of an NPN transistor 176 through a resistor 178. The junction of the base of transistor 176 and the resistor 178 is connected to ground through a resistor 180. The emitter of the transistor 176 is connected to ground. The collector of the transistor 176 is connected to the base of another NPN transistor 182. The collector of the transistor 182 is connected to the +15 volt supply and the base of the transistor 182 is connected to the +15 volt supply through a resistor 184. The emitter of the transistor 182 is connected to the base of a PNP transistor 186 through a forward diode 188, a resistor 190 and a reverse diode 192. The junction of the resistor 190 and the diode 192 is connected to ground through a resistor 194 and to the −15 volt supply through a resistor 196. The emitter of the transistor 186, is connected to ground and a light emitting diode 198 is attached to the collector of the transistor 186. The light emitting diode 198, in turn, is connected to a photocoupler 200. The photocoupler 200 is attached to the −15 volt supply through a resistor 202. The light emitting diode 198 provides a visual indication of variations in modulation and the photocoupler 200 is used to couple the output from this portion of circuit 10 to an isolated line voltage alarm or to a control circuit external to the circuit 10. cl EXAMPLE OF COMPONENT VALUE The values for components for the circuit 10 are given in the following table.

| Resistors | Ohms |
| --- | --- |
| 38 | 120 |
| 46 | 2.7K |
| 48 | 1Meg |
| 56 | 33K |
| 58,68 | 10K |
| 60,62 | 50K |
| 66 | 22K |
| 80,168,174 | 100K |
| 86,100,128,142,178,184,196 | 15K |
| 98,144,194 | 1.8K |
| 94,134,190 | 1.5K |
| 106,150,202 | 560 |
| 108 | 100 |
| 110 | 6.8K |
| 122 | 5.6Meg |
| 118,152,154 | 56K |
| 180 | 1.2K |
| 162,164 | 1.0Meg |
| Capacitors | |
| 42 | .01uf |
| 50,54 | 510pf |
| 64,114 | .1uf |
| 82 | 1MF |
| 140 | 100MF |
| 124 | .05uf |
| 156 | .5uf |
| 172 | 50MF |
| Transistors | |
| 88,130,176,182 | 2N3567 |
| 90,138,186 | 2N3644 |

What is claimed is:

1. An RF generator monitor circuit for checking for variation in frequency of an RF generator outside predetermined limits, said circuit including
   means for sampling the output of an RF generator,
   means for clamping the sampled R.F. signal to prevent damage to the circuit from an exceptionally strong signal,
   means for converting the clamped sample signal to a positive going square wave and for amplifying the square wave,
   a phase locked loop integrated circuit having the amplified square wave as an input, said phase locked loop integrated circuit including a linear voltage-controlled oscillator and two different phase comparators, said phase locked loop integrated circuit including connections for comparing in both phase comparators, the input square wave signal with the voltage controlled oscillator output, for producing an error voltage proportonal to phase differences in at least one of said phase comparators, and for using the at lease one error voltage as a control for the voltage controlled oscillator, whereby when the input square wave signal is within the predetermined frequency limits the at least one error voltage causes the voltage controlled oscillator to be adjusted to a frequency equal to that of the input signal and when said input signal is outside the predetermined limits said phase comparators providing error voltages as output signals indicative thereof.

2. The circuit as defined in claim 1 wherein said means for sampling includes a pickup coil, said means for clamping includes diodes connected between an input lead and ground, said means for converting and said means for amplifying include an inverting amplifier.

3. The circuit as defined in claim 1 including means for indicating that the frequency of an input signal is outside the predetermined limits.

4. The circuit as defined in claim 3 wherein said means for indicating includes a light emitting diode.

5. The circuit as defined in claim 3 wherein said means for indicating includes a photocoupler.

6. The circuit as defined in claim 3 wherein said means for indicating includes two transistors, a first transistor being controlled by the outputs of said phase comparators and the second transistor being controlled by the first transistor.

7. An RF generator monitor circuit for checking frequency, amplitude and modulation of an RF generator output, said circuit including means for sampling the output of an RF generator, means for clamping the sample signal to prevent damage to the circuit from an exceptionally strong signal, three portions of the circuit connected to said means for clamping, a first of said three portions for monitoring frequency, a second of said three portions for monitoring amplitude and a third of said three portions for monitoring modulation percentage, said first portion for monitoring frequency including means for converting the clamped sample signal to a positive going square wave and for amplifying the square wave and a phase locked loop integrated circuit having the amplified square wave as an input, said phase locked loop integrated circuit including a linar voltage-controlled oscillator and two different phase comparators, said phase locked loop integrated circuit including connections for comparing, in both phase comparators, the input squar wave signal to the voltage controlled oscillator output, for producing an error voltage proportional to phase differences in at least one of said phase comparators, and for using the at least one error voltage as a control for the voltage controlled oscillator, and said first portion also including means coupled to outputs of said phase comparators for indicating that the frequency of an input signal is outside a predetermined frequency limit, said second portion for monitoring amplitude including a first comparator amplifier having high gain the output of said high gain comparator amplifier switching from positive to negative when amplitude exceeds a predetermined limit, said second portion also including means coupled to said first comparator amplifier for indicating that the amplitude of an input signal is outside a predetermined amplitude limit, and said third portion for monitoring modulation including a second comparator amplifier having two inputs, one input connected to an integrating capacitor which is connected to an output of an alternating current coupled amplifier stage and the other input connected to a follower amplifier, wherein the output of said comparator amplifier is related to percentage of amplitude modulation, said third portion also including means coupled to said second comparator amplifier for indicating that the modulation percentage of an input signal is outside a predetermined modulation percentage limit.

* * * * *